United States Patent [19]

Morimoto et al.

[11] Patent Number: 5,364,460
[45] Date of Patent: Nov. 15, 1994

[54] ELECTROLESS GOLD PLATING BATH

[75] Inventors: Keizin Morimoto; Masanobu Tsujimoto; Tomomi Yaji; Tooru Murakami, all of Hirakata, Japan

[73] Assignee: C. Uyemura & Co., Ltd., Osaka, Japan

[21] Appl. No.: 217,717

[22] Filed: Mar. 25, 1994

[30] Foreign Application Priority Data

Mar. 26, 1993 [JP] Japan ................... 5-092203

[51] Int. Cl.$^5$ ............................................. C23C 18/44
[52] U.S. Cl. ................................. 106/1.23; 106/1.26
[58] Field of Search ............................. 106/1.23, 1.26

[56] References Cited

U.S. PATENT DOCUMENTS

| H325 | 9/1989 | Mallory, Jr. et al. | 106/1.26 |
| 4,830,668 | 5/1989 | Wundt et al. | 106/1.26 |
| 5,232,492 | 8/1993 | Krulik et al. | 106/1.26 |

FOREIGN PATENT DOCUMENTS 1144304  4/1983  Canada .

*Primary Examiner*—Helene Klemanski
*Attorney, Agent, or Firm*—Sughrue, Mion, Zinn, Macpeak & Seas

[57] ABSTRACT

To a neutral electroless gold plating bath comprising a gold sulfite, a sulfite, and a reducing agent, there are added an organic phosphonic acid or a salt thereof and an optional stabilizer in the form of a non-ionic surfactant or non-ionic polymer. A gold plating film having an aesthetic lemon yellow color tone and susceptible to bonding deposits on an article from the bath without attacking the base material of the article and without plating spread.

8 Claims, No Drawings

ELECTROLESS GOLD PLATING BATH

BACKGROUND OF THE INVENTION

1. Field of the Invention

This invention relates to an electroless or chemical gold plating bath and more particularly, to an electroless gold plating bath suitable for forming a gold plating film on metal portions on printed circuit boards, ceramic IC packages, ITO substrates, IC cards, etc.

2. Prior Art

For utilizing the advantages of gold including its physical properties such as electric conduction and thermal bonding ability and its chemical properties such as oxidation resistance and chemical resistance, electroless gold plating has heretofore been applied to terminals and circuit surfaces of electronic industry parts including printed circuit boards, ceramic IC packages, ITO substrates, and IC cards.

Conventional well-known electroless gold plating baths are strongly alkaline baths containing cyanoaurates, caustic alkalis and boron hydrides. Because of strong alkalinity, however, these electroless gold plating baths undesirably attack the resist of printed circuit boards and aluminum nitride and glass material of IC packages. Inclusion of a cyanide ion gives rise to a problem against environmental protection.

Also known in the art are neutral baths containing sulfites and hydrazines. Gold plating films resulting from these baths look discolored to a reddish color tone to naked eyes because the films are made of small and angular crystals. This crystallography also prevents the plating films from lending themselves to surface cleaning and gold wire bonding. Since there customarily prevails the empirical knowledge that gold plating films having good function have an aesthetic lemon yellow color tone, those gold plating films of poor tone are rather unacceptable as commercial products, that is, of lower commercial value even if they are susceptible to wire bonding.

In addition, the neutral baths tend to incur plating spread in that a coating also deposits at non-intended places, causing stains or blur. This tendency is exacerbated especially in the plating of a metal portion on a ceramic base, resulting in a plating film extending from the metal portion to the surrounding ceramic base surface.

SUMMARY OF THE INVENTION

Therefore, an object of the present invention is to provide an electroless gold plating bath which can form a gold plating film having an aesthetic lemon yellow color tone and susceptible to wire and die bonding without attacking the resist of printed circuit boards and aluminum nitride and glass material of IC packages and without giving rise to the problem of plating spread.

Starting from a neutral electroless gold plating bath comprising a gold sulfite, a sulfite, and a reducing agent selected from the group consisting of a hydrazine, ascorbic acid, an ascorbic salt, trimethylamineborane, and dimethylamineborane, which does not attack the resist of printed circuit boards and aluminum nitride and glass material of IC packages, we have found that by adding an organic phosphonic acid or a salt thereof to the bath, the gold plating film is improved in crystallography. That is, there is obtained a gold plating film having an aesthetic lemon yellow color tone and susceptible to wire and die bonding. At the same time, the occurrence of plating spread is effectively restrained.

Accordingly, the present invention provides an electroless gold plating bath comprising a gold sulfite, a sulfite, and a reducing agent selected from the group consisting of a hydrazine, ascorbic acid, a salt of ascorbic acid, trimethylamineborane, dimethylamineborane, and a mixture thereof, characterized in that an organic phosphonic acid or a salt thereof is added to the bath. The bath may further contain a thiosulfate, a nitrogenous compound, and/or an oxycarboxylic acid or its derivative.

DETAILED DESCRIPTION OF THE INVENTION

A gold sulfite is contained as a gold source in the electroless gold plating bath of the invention. Typical gold sulfites are sodium gold sulfite, potassium gold sulfite, and ammonium gold sulfite. The gold sulfite may be blended in any desired amount although the preferred concentration is 1 to 20 grams/liter, especially 2 to 8 grams/liter of gold ion. In general, the plating rate increases in substantial proportion to the amount of the gold sulfite blended, that is, the concentration of gold ion in the plating bath. Concentrations in excess of 20 grams/liter are less desirable despite an increased plating rate because the plating bath would become less stable and the drag-out of the expensive gold compound is increased against economy. The plating rate is very low at concentrations below 1 grams/liter of gold ion.

The sulfite is a complexing agent for the gold ion. Useful sulfites are sodium sulfite, potassium sulfite, and ammonium sulfite. The sulfite may be blended in any desired amount although the preferred concentration is 5 to 150 grams/liter, especially 20 to 100 grams/liter. Less than 5 grams/liter of the sulfite would be less effective as a complexing agent and render the bath less stable whereas more than 150 grams/liter of the sulfite would provide no further advantage and is thus uneconomical.

The reducing agent is selected from the group consisting of a hydrazine, ascorbic acid, a salt of ascorbic acid, trimethylamineborane (TMAB), and dimethylamineborane (DMAB). Examples of the hydrazine include hydrazine compounds such as hydrazine hydrate, hydrazine sulfate, neutral hydrazine sulfate, and hydrazine maleate, salts thereof, and hydrazine derivatives such as hydroxylamine. The salts of ascorbic acid are sodium, potassium and ammonium salts, for example.

The reducing agent is effective for causing gold ions in the plating bath to deposit on an article to be plated. The above-mentioned reducing agents may be used alone or in admixture of two or more. Preferably one or more hydrazines are used as at least a part of the reducing agent although the invention is not limited thereto.

The amount of the reducing agent blended is suitably determined in accordance with its type. Where hydrazines or other reducing agents are used alone, the preferred concentration is about 1 to 100 grams/liter, especially 5 to 70 grams/liter. Where a hydrazine is used in admixture with another reducing agent, the hydrazine is blended in the same concentration as in the single use and the other reducing agent is blended in a concentration of 0.1 to 30 grams/liter, especially 0.3 to 20 grams/liter. In general, the plating rate increases in substantial proportion to the concentration of the reducing agent.

Concentrations beyond the range would be less effective for accelerating the plating rate and rather render the plating bath less stable. Plating becomes very slow at concentrations below the range.

To an electroless gold plating bath comprising a gold sulfite, a sulfite, and a reducing agent is added an organic phosphonic acid or a salt thereof for improving the crystallography of a gold film being deposited therefrom. The composition ensures that the bath produces a gold plating film having an aesthetic lemon yellow color tone and susceptible to wire and die bonding without the substantial occurrence of plating spread.

Examples of the organic phosphonic acid used herein include aminotri(methylenephosphonic acid) and salts thereof, 1-hydroxyethylidene -1,1-diphosphonic acid and salts thereof, ethylenediaminetetra(methylenephosphonic acid) and salts thereof, and diethylenetriaminepenta(methylenephosphonic acid) and salts thereof although the phosphonic acid is not limited thereto. Sodium, potassium and ammonium salts are the preferred salts. Among these ethylenediaminetetra(methylenephosphonic acid) and its salts are preferred since they are effective in improving the color tone of plating film and the stability of the bath.

The organic phosphonic acid or salt may be blended in any desired amount although the preferred concentration is 1 to 200 grams/liter, especially 10 to 150 grams/liter. Less than 1 gram/liter of the organic phosphonic acid would be less effective whereas more than 200 grams/liter would provide no further advantage.

The electroless gold plating bath of the invention containing a gold sulfite, a sulfite, a reducing agent, and an organic phosphonic acid or a salt thereof all as defined above yields a gold plating film having an aesthetic lemon yellow color tone and susceptible to wire and die bonding without substantial occurrence of plating spread. The occurrence of plating spread is not completely avoided when the article to be plated is a ceramic article. In this case, a non-ionic surfactant and/or a non-ionic polymer may be added as a stabilizer for restraining plating spread.

Examples of the non-ionic surfactant include polyalkylene glycols having a molecular weight of 200 to 9,000, preferably 500 to 4,000 such as polyethylene glycol (PEG) and polypropylene glycol (PPG), typically PEG-4000, PEG -1540, PPG-1000 and PEG-600, polyalkylene glycol type surfactants such as polyoxyethylene alkylphenol ethers, polyoxyethylene alkyl ethers, polyoxyethylene fatty acid esters, polyoxyethylene alkyl amines, polyoxyethyleneoxypropylene block polymers, and ethylene oxide adducts of acetylene glycol. Exemplary ethylene oxide (EO) adducts are EO adducts of nonylphenol, EO adducts of beta-naphthol, EO adducts of lauryl alcohol, and EO adducts of tallow amine, with the preferred moles of alkylene oxide added being about 5 to 100. Examples of the non-ionic polymer include polyvinyl alcohol, e.g., Gosenol NL-05 commercially available from The Nippon Synthetic Chemical Industry Co., Ltd. and polyvinyl pyrrolidone, e.g., K-12, K-15, K-30, K-60, and K-90 commercially available from Kishida Reagents Chemicals Co., Ltd.

These non-ionic surfactant and polymer stabilizers may be used alone or in admixture of two or more. The addition amount is suitable selected depending on a particular type of stabilizer although 0.1 to 100 mg/liter, especially 0.3 to 30 mg/liter of the stabilizer is preferred. Below the range, the stabilizer would not be effective for restraining plating spread. Too much amounts of the stabilizer would slow down the plating rate.

Several advantages are obtained from the addition of the stabilizer. Even when an article to be plated is a metal portion formed on a ceramic substrate, the stabilizer ensures that a satisfactory gold coating is deposited only on the metal portion without incurring plating spread. The stabilizer is also effective for preventing decomposition of the plating solution. Although the mechanism of the stabilizer achieving such advantages is not well understood, we have the following hypotheses.

One probable presumption is that the stabilizer is adsorbed to a gold plating film or gold colloid particles resulting from solution decomposition, thereby preventing gold deposition. A certain mechanism allows plating to proceed on the plating film, but not on the gold colloid particles, thereby preventing solution decomposition and plating spread. An alternative presumption is that the stabilizer is adsorbed to a ceramic portion of an article to prevent gold deposition thereon. That is, the stabilizer is selectively adsorbed to the ceramic rather than to the gold plating film to prevent plating spread. A further presumption is that since gold colloid particles have a remarkably larger surface area per unit volume than the plating surface, the stabilizer prevents plating spreads by selectively preventing growth of gold colloid to restrain decomposition of the plating solution and by preventing gold colloid particles resulting from solution decomposition from being adsorbed to the ceramic to form nuclei from which plating grows.

In addition to the gold sulfite, sulfite, reducing agent, organic phosphonic acid or salt, and optionally, stabilizer, the electroless gold plating bath of the invention may further contain a nitrogenous compound which is effective for increasing the plating rate.

Examples of the nitrogenous compound used include ammonia, aminocarboxylic acids, iminocarboxylic acids, other water-soluble nitrogen-containing organic compounds and salts thereof. Examples of the ammonia and salts thereof include aqueous ammonia, ammonium sulfate, ammonium chloride, ammonium acetate, and ammonium nitrate. Examples of the aminocarboxylic acid include essential amino acids and examples of the iminocarboxylic acid are ethylenediaminetetraacetic acid and nitrilotriacetic acid. Examples of the other water-soluble nitrogen-containing organic compound include amines such as ethylenediamine, diethylenetriamine, triethylenetetramine, tetraethylenepentamine, hexamethylenetetramine, and guanidine; aminoalcohols such as monoethanolamine, diethanolamine, and triethanolamine; aromatic amines such as p-methylaminophenol, aminophenol, phenylenediamine, anthranilic acid, and aminobenzoic acid; heterocyclic compounds such as imidazole, uracil, morpholine, and pyrazine; nitrogenous sulfonic acids such as bis(hydroxyethyl)aminoethanesulfonic acid, metanilic acid, anthranilic acid, pyridinesulfonic acid, 8-hydroxyquinoline -5-sulfonic acid, and taurine; and pyridines such as dipyridyl, picolinic acid, and dihydroxypyridine. Preferred water-soluble nitrogenous organic compounds are aromatic compounds such as p-methylaminophenol, aminophenol, metanilic acid and anthranilic acid though not limited thereto. The amount of the nitrogenous compound added is suitably selected depending on its type or the like and not critical. For ammonia and analogs, the preferred amount is 1 to 200 grams/liter, especially 5 to 150 grams/liter. For the aminocarboxylic acids, iminocarboxylic acids and other water-soluble nitrogen-containing organic compounds, the preferred amount is 0.01 to 100 grams/liter, especially 0.05 to 50 grams/liter.

To the plating bath of the invention, a thiosulfate and an oxycarboxylic acid or its derivative may be added. The thiosulfate is effective for complexing with a gold ion for further improving the plating rate and bath stability. Exemplary are sodium thiosulfate, potassium thiosulfate, and ammonium thiosulfate. Preferably the amount of thiosulfate added is 0.1 to 30 grams/liter, especially 0.1 to 3 grams/liter, with the plating rate peaking at a thiosulfate concentration of 1 gram/liter. Less than 0.1 gram/liter of thiosulfate would not be effective for its purpose whereas more than 30 grams/liter would provide no further advantage and rather lower the plating rate and bath stability. The oxycarboxylic acid or its derivative is effective for improving bath stability and color tone. Exemplary are citric acid, tartaric acid, sodium, potassium and ammonium salts of citric acid and tartaric acid, glucono-δ-lactone, sodium gluconate, and potassium gluconate. Preferably the amount of oxycarboxylic acid or its derivative added is 5 to 100 grams/liter, especially 10 to 70 grams/liter.

When it is desired to plate gold on a copper substrate using the plating bath of the invention, a copper ion can be leached into the bath and gold deposition can take place where copper ion leaching has took place. To prevent the copper leaching, the plating bath may further contain benzotriazole and/or cyanide ion ($CN^-$). Benzotriazole is adsorbed on copper or form a water-insoluble chelate with a copper ion for preventing dissolution of a copper ion. Although the interaction mechanism of cyanide ion is not well understood, it is presumed that $Cu^+$ and $CN^-$ form a complex to decrease the reducing power of $Cu^+$.

Although the amount of benzotriazole added is not critical, it is preferably 0.001 to 10 grams/liter, especially 0.01 to 1 gram/liter. Less than 0.001 gram/liter of benzotriazole would not be effective whereas more than 10 grams/liter would provide only a slight increase of its effect and sometimes lower the plating rate. The amount of cyanide added is preferably 10 to 2000 mg/liter, especially 50 to 1,000 mg/liter. Less than 10 mg/liter of cyanide would not be effective whereas more than 2,000 mg/liter of cyanide would attack the resist of printed circuit boards and aluminum nitride and glass materials of IC packages. The cyanide source for supplying a cyanide ion to the plating bath includes NaCN, KCN, $Na[Au(CN)_2]$ and $K[Au(CN)_2]$.

While the electroless gold plating bath contains the gold sulfite, sulfite, reducing agent, organic phosphonic acid or salt, and optionally, stabilizer, nitrogenous compound, thiosulfate, oxycarboxylic acid, benzotriazole and cyanide as mentioned above, the bath may further contain an additive commonly used in conventional electroless gold plating baths, for example, lead and thallium ions.

When plating is carried out using the electroless gold plating bath of the invention, an article to be plated such as a printed circuit board and ceramic IC package is immersed in the bath. The printed circuit board and ceramic IC packages are preferably those having an electroless plating Ni/B film and/or an electroless plating Ni/P film formed thereon and a gold replacement plating film formed further thereon although the invention is not limited thereto.

Next the plating conditions are described. The plating bath preferably has a pH of 6 to 11, especially 7 to 9. Below pH 6, the plating rate would be low. Above pH 11, the bath would become less stable despite a higher plating rate and attack those articles which are less alkali resistant.

The plating temperature or bath temperature is preferably about 40° to 90° C., especially about 50° to 80° C. The plating rate would be too low at temperatures lower than 40° C. At temperatures above 90° C., plating stability would be lost despite an increased plating rate. The plating solution may be agitated. A mechanism of striking an article to be plated by a hammer is preferably set to prevent generation of gas pits. The solution may be filtered batchwise or by circulation. Preferably the plating solution is pumped and circulated through a filter for eliminating a temperature variation of the solution and removing solid debris from the solution. Vigorous agitation of the plating solution can retard plating, resulting in a low plating rate. Therefore, agitation of the plating solution, circulation of the plating solution for filtering and rocking of an article to be plate should preferably be moderate.

It is also possible to introduce air into the plating bath because air introduction is effective for preventing generation of gold colloid particles or gold particles in the bath. Although the effect of air introduction is not well understood, it is presumed that Au can be effectively dissolved by $SO_3^{2-}$ in the presence of $O_2$ through a mechanism similar to the well-known reaction:

$$CN^- + O_2 + Au \rightarrow Au^+.$$

Where copper is the underlying metal, it is presumed that although copper can be leached into the plating solution to generate gold particles through the reaction:

$$Au^+ + Cu^+ \rightarrow Au\downarrow + Cu^{2+},$$

$Cu^+$ generated as a result of leaching is oxidized by $O_2$ into non-harmful $Cu^{2+}$. Although it is unknown whether or not the above-mentioned reaction $Au^+ + Cu^+ \rightarrow Au\downarrow + Cu^{2+}$ proceeds, it was empirically found that Au deposited where Cu leaching occurred.

Air can be introduced into the plating bath by blowing air therein. Then the procedure of agitating the plating bath may be air agitation whereby air is introduced at the same time as agitation. Alternatively air may be blown into the bath separately from agitation. Preferably air is blown into the plating bath so as to avoid direct contact with the surface being plated. To this end, an air partition may be disposed in the plating bath. If air directly contacts the surface being plated, solution flow at the plating interface becomes faster and uneven, resulting in inconveniences such as uneven color and uneven thickness of a plating film and a lowering of plating rate.

A plating rate of about 0.1 to about 5 μm/hr. is generally available with the electroless gold plating bath of the invention. Self catalysis is expected when a plating film is formed on a gold plate (gold plating film). By replenishing the gold source and reducing agent for their consumption, the bath can be used about 5 turns (5×M grams/liter wherein M is a gold ion concentration at the initial bath).

EXAMPLE

Examples of the present invention are given below by way of illustration and not by way of limitation.

Example 1

A patterned substrate for a bonding test was prepared by applying an electroless plating Ni—P film of 7 μm thick to a copper foil and applying a replacement plating gold film of 0.1 μm thick thereto. A permanent resist was printed on the substrate. The substrate was immersed in a plating bath of the following composition wherein electroless gold plating was carried out under the following conditions. The plating rate was 0.6 μm/hr.

| Plating bath composition | |
|---|---|
| Sodium gold sulfite | 3 g/l as monovalent gold ion |
| Sodium sulfite | 70 g/l |
| Sodium ethylenediamine-tetra(methylene phosphonate) | 110 g/l |
| Hydrazine hydrate | 10 g/l |
| pH | 7 |
| Plating conditions | |
| Temperature | 60° C. |
| Solution volume | 500 ml |
| Agitation | air agitation |
| Time | 60 min. |

At the end of plating, the test substrate was inspected. The gold plating film appeared to have an aesthetic lemon yellow color. Neither substrate corrosion nor plating spread was found. The substrate was fully susceptible to gold wire bonding and die bonding.

Example 2

A test substrate was subjected to electroless gold plating by the same procedure as in Example 1 except that 2 g/l of sodium thiosulfate, 2 g/l of phenylenediamine, 8 g/l of EDTA, and 35 g/l of dipotassium monohydrogen citrate were added to the plating bath of Example 1. The plating rate was 0.8 μm/hr.

At the end of plating, the test substrate was inspected. The gold plating film appeared to have an aesthetic lemon yellow color. Neither substrate corrosion nor plating spread was found. The substrate was fully susceptible to gold wire bonding and die bonding.

Example 3

A test substrate was subjected to electroless gold plating by the same procedure as in Example 2 except that 0.5 mg/l of Gosenol NL-05 was added to the plating bath of Example 2. The plating rate was 0.6 μm/hr.

At the end of plating, the test substrate was inspected. The gold plating film appeared to have an aesthetic lemon yellow color. Neither substrate corrosion nor plating spread was found. The substrate was fully susceptible to gold wire bonding and die bonding.

Example 4

A test substrate was prepared from an aluminum nitride substrate having a metallized pattern thereon by forming an electroless plating Ni—B film of 1 μm thick thereon, forming an electroless plating Ni—P film of 2 μm thick thereon, and forming a replacement plating gold film of 0.1 μm thick thereon. The substrate was subjected to electroless gold plating using the same bath and procedure as in Example 3.

At the end of plating, the test substrate was inspected. The gold plating film appeared to have an aesthetic lemon yellow color. Neither substrate corrosion nor plating spread was found. The substrate was fully susceptible to gold wire bonding and die bonding.

Example 5

The same test substrate as used in Example 4 was subjected to electroless gold plating using the same bath and procedure as in Example 1 except that the amount of sodium gold sulfite blended was changed to 4 g/l calculated as gold ion, the bath had pH 7.5, and the plating time was 3 hours.

The resulting gold plating film had an average thickness of 2 μm and appeared to have an aesthetic lemon yellow color. The plating film was subjected to a heat resistant test by heating it at 450° C. for 5 hours. With no deterioration like discoloration found, the film was regarded fully heat resistant. A die bonding test was carried out, obtaining good results. The gold plating film had some plating spread.

Example 6

A test substrate was subjected to electroless gold plating using the same bath and procedure as in Example 5 except that 2 g/l of ascorbic acid was added to the plating bath of Example 5.

The resulting gold plating film had an average thickness of 2 μm and appeared to have an aesthetic lemon yellow color. The plating film was subjected to the same heat resistant test and die bonding test as in Example 5, obtaining good results in both the tests. The gold plating film had some plating spread.

Example 7

A test substrate was subjected to electroless gold plating using the same plating bath and procedure as in Example 1 except that 2 g/l of sodium thiosulfate, 10 g/l of glucono-δ-lactone, and 35 g/l of tartaric acid were added to the bath of Example 1. The plating rate was 0.8 μm/hr.

At the end of plating, the test substrate was inspected. The gold plating film appeared to have an aesthetic lemon yellow color. Neither substrate corrosion nor plating spread was found. The substrate was satisfactory with respect to gold wire bonding and die bonding.

Example 8

A test substrate was subjected to electroless gold plating using the same plating bath and procedure as in Example 1 except that 4 g/l of sodium thiosulfate, 35 g/l of trisodium citrate, and 30 g/l of anthranilic acid were added to the bath of Example 1. The plating rate was 0.5 μm/hr.

Example 9

A test substrate was subjected to electroless gold plating using the same plating bath and procedure as in Example 1 except that 2 g/l of sodium thiosulfate, 10 g/l of glucono-δ-lactone, and 30 g/l of metanilic acid were added to the bath of Example 1. The plating rate was 0.6 μm/hr.

At the end of plating, the test substrates of Examples 8 and 9 were inspected. The gold plating films appeared to have an aesthetic lemon yellow color. Neither substrate corrosion nor plating spread was found. The substrates were satisfactory with respect to gold wire bonding and die bonding.

Comparative Example 1

The same test substrate as used in Example 1 was subjected to electroless gold plating using the same bath and procedure as in Example 1 except that the organic phosphonic acid was replaced by 110 g/l of EDTA-2Na. The plating rate was 0.5 μm/hr. which was slower than in Example 1.

The resulting gold plating film had a somewhat reddish appearance and plating spread and was of less commercial value. Wire bonding was substantially equal to the result of Example 1.

Comparative Example 2

The same test substrate as used in Example 2 was subjected to electroless gold plating using the same bath and procedure as in Example 2 except that the organic phosphonic acid was replaced by 110 g/l of EDTA-2Na.

The resulting gold plating film had a somewhat reddish appearance and plating spread and was of less commercial value. Wire bonding was substantially equal to the result of Example 2.

There has been described an electroless gold plating bath which can form a gold plating film having an aesthetic lemon yellow color tone and susceptible to wire and die bonding without attacking the resist of printed circuit boards and aluminum nitride and glass material of IC packages and without giving rise to the problem of plating spread.

Although some preferred embodiments have been described, many modifications and variations may be made thereto in the light of the above teachings. It is therefore to be understood that within the scope of the appended claims, the invention may be practiced otherwise than as specifically described.

We claim:

1. An electroless gold plating bath comprising
   a gold sulfite,
   a sulfite as a complexing agent for gold ion,
   at least one reducing agent selected from the group consisting of a hydrazine, ascorbic acid, a salt of ascorbic acid, trimethylamineborane, and dimethylamineborane, and
   an organic phosphonic acid or a salt thereof.

2. A bath according to claim 1 wherein the amount of the gold sulfite is 1 to 20 grams/liter, the amount of the sulfite as the complexing agent for gold ion is 5 to 150 grams/liter, the amount of the reducing agent is 1 to 100 grams/liter, and the amount of the organic phosphonic acid or the salt thereof is 1 to 200 grams/liter.

3. A bath according to claim 1 wherein the organic phosphonic acid is aminotri(methylenephosphonic acid), 1-hydroxyethylidene-1,1-diphosphonic acid or ethylenediaminetetra(methylenephosphonic acid).

4. A bath according to claim 1 which further contains a nitrogenous compound.

5. A bath according to claim 4 wherein the nitrogenous compound is selected from the group consisting of p-methylaminophenol, aminophenol, metanilic acid and anthranilic acid.

6. A bath according to claim 4 wherein the amount of nitrogenous compound is 0.01 to 100 grams/liter.

7. A bath according to claim 1 which further contains a thiosulfate in an amount of 0.1 to 30 grams/liter.

8. A bath according to claim 1 which further contains an oxycarboxylic acid or a derivative thereof in an amount of 5 to 100 grams/liter.

* * * * *